United States Patent [19]

Baker

[11] Patent Number: 4,677,395

[45] Date of Patent: Jun. 30, 1987

[54] DIGITAL PHASE SHIFTER

[75] Inventor: Daniel G. Baker, Aloha, Oreg.

[73] Assignee: Tektronix, Inc., Beaverton, Oreg.

[21] Appl. No.: 835,688

[22] Filed: Mar. 3, 1986

[51] Int. Cl.⁴ .............................................. H03L 7/00
[52] U.S. Cl. ........................................... 331/25; 331/20
[58] Field of Search .............................. 331/18, 20, 25; 307/260, 262; 358/17, 19, 337; 329/122

[56] References Cited

U.S. PATENT DOCUMENTS 4,042,884  8/1977  Querry ................................ 331/25 X
4,056,761 11/1977  Jacoby et al. ..................... 331/25 X Primary Examiner—Eugene R. LaRoche
Assistant Examiner—Robert J. Pascal
Attorney, Agent, or Firm—Francis I. Gray

[57] ABSTRACT

A digital phase shifter uses a heterodyne concept to mix a continuous wave (cw) signal with a local oscillator which is an integer multiple of the difference frequency. The difference frequency is phase-locked, and the local oscillator frequency is divided into N increments by a counter. The count of the counter is compared to a microprocessor generated phase shift value which is added to the difference frequency. The phase shifted difference frequency is then converted up to produce the phase shifted continuous wave signal.

10 Claims, 9 Drawing Figures

DIGITAL PHASE SHIFTER

BACKGROUND OF THE INVENTION

The present invention relates to phase shifters, and more particularly to a digital phase shifter for precisely and continuously phase shifting a continuous wave (cw) signal output.

A straight forward method for constructing a subcarrier regenerator for television systems is shown in FIG. 1. A reference subcarrier is input to a phase detector. The output of the phase detector is used to control, via an error amplifier, a voltage controlled crystal oscillator (VCXO) at the subcarrier frequency. The output of the oscillator is fed back via a variable phase shifter to the phase detector, and also output via a buffer amplifier as a phase shifted subcarrier frequency. This closed loop method provides a constant amplitude sine wave that has been phase shifted from the external reference subcarrier. The phase-locked loop bandwidth need only be wide enough to allow the variable phase shift to appear instantaneous, and should be narrow enough to do some phase noise averaging on the input reference burst or subcarrier.

Traditionally the variable phase shifting has been implemented using an electromechanical phase shifter such as a goniometer with manual control. This requires the subcarrier to be cabled to and from the front panel of an instrument. For a precision phase shift a second, limited range electro-mechanical phase shifter is needed. This prior concept is expensive and requires careful calibration. There is no reasonable means of remote control or microprocessor interface possible.

What is desired is a digitally controlled precision phase shifter that can be controlled by a microprocessor with a resolution of 0.1 degrees or better, and which is reliable, self calibrated and inexpensive.

SUMMARY OF THE INVENTION

Accordingly the present invention provides a digital phase shifter for precisely and continuously shifting the phase of a cw signal output. A cw signal is heterodyned with a local oscillator frequency which is an integer multiple of the difference frequency. The local oscillator frequency is divided into N increments and compared with a microprocessor generated phase shift value. The difference frequency is phase shifted by that value and then converted up to the frequency of the cw signal shifted by that value. This results in a precise control of the phase of the cw signal.

The objects, advantages and novel features of the present invention will be apparent from the following detailed description when read in conjunction with the appended claims and attached drawing.

DESCRIPTION OF THE PREFERRED EMBODIMENT

The fundamental principle involved in this invention is described by the equation $$\cos(w_{sc}t+\phi) * \cos(w_{lo}t) = \tfrac{1}{2}\{\cos[(w_{lo}+w_{sc})t+\phi] + \cos[(w_{lo}-w_{sc})t+\phi]\}.$$

Figure 1:
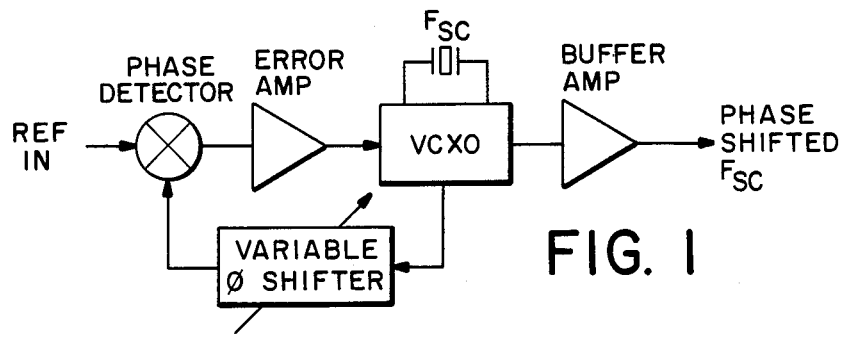
FIG. 1 is a block diagram of a typical phase-locked oscillator loop with a variable phase shifter.
Figure 2:
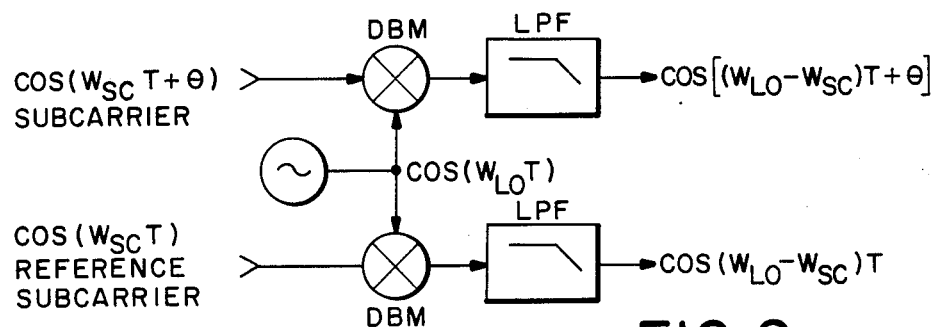
FIG. 2 is a block diagram of the basic heterodyne concept used in the present invention.

This equation is a form of the familiar trigonometric identity describing the result of the multiplication of two sinusoids as occurs in a double balanced mixer where $F_{lo}$ is a higher frequency than $F_{sc}$. The right side of the equation describes the mixer output as two sinusoids at the sum and difference of the input frequencies. The input signals are described as a subcarrier ($w_{sc}$) sine wave with a phase offset ($\phi$) with respect to some reference frequency, and as a local oscillator ($w_{lo}$) sine wave. The equation demonstrates that the subcarrier phase ($\phi$) is translated to the low frequency difference component ($w_{lo}-w_{sc}$) of the mixer output. This component can be recovered with a simple low pass filter as shown in FIG. 2.

Figure 3:
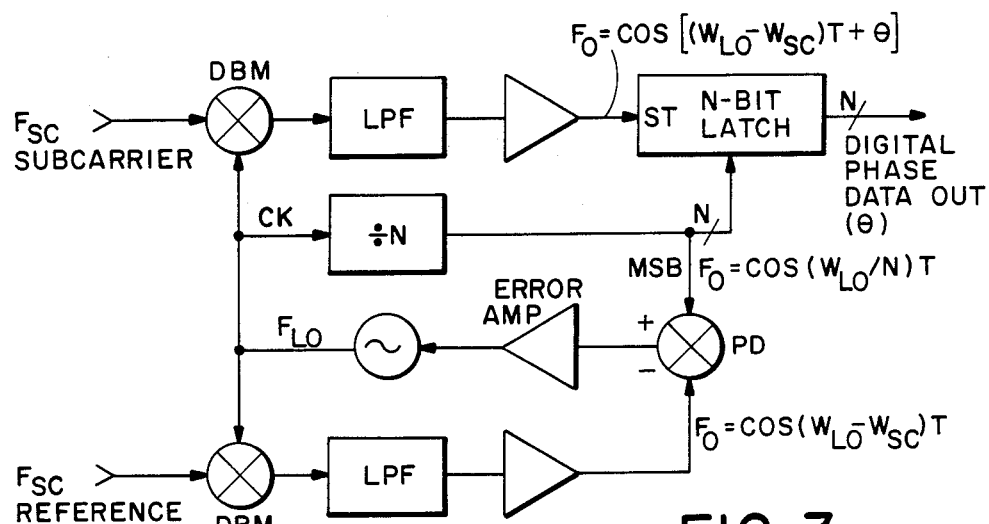
FIG. 3 is a block diagram of a prior art circuit for determining the phase of a signal with high resolution.

The relative phase between the two low frequency sinusoids at the output is identical to the relative phase between the subcarrier and reference subcarrier sinusoids at the input. This means that a phase error caused by a small time delay in the subcarrier signal is reproduced as the same phase error in the low frequency outputs, multiplying the time error by the frequency ratio. This magnified time error can then be digitally divided into a large number of integral parts allowing the phase to be determined with high resolution as shown in FIG. 3 and described at the 1969 Television Measurements Conference, London, England by L. E. Weaver and J. Lewis in a paper entitled "The Digital Measurement of Colour Subcarrier Phase." To provide 0.1 degrees resolution N is 3600, and for a television system $F_{sc}=3.58$ MHz, resulting in $F_o=994$ Hz and $F_{lo}=F_{sc}+F_o$.

Figure 4:
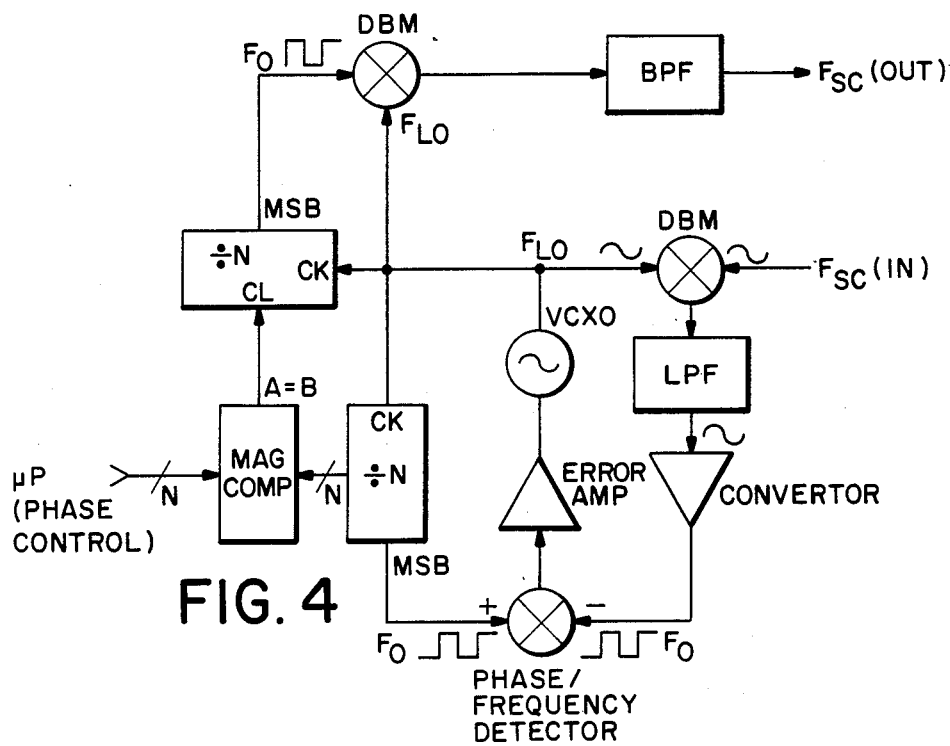
FIG. 4 is a simplified block diagram for a digital phase shifter according to the present invention.
Figure 5:
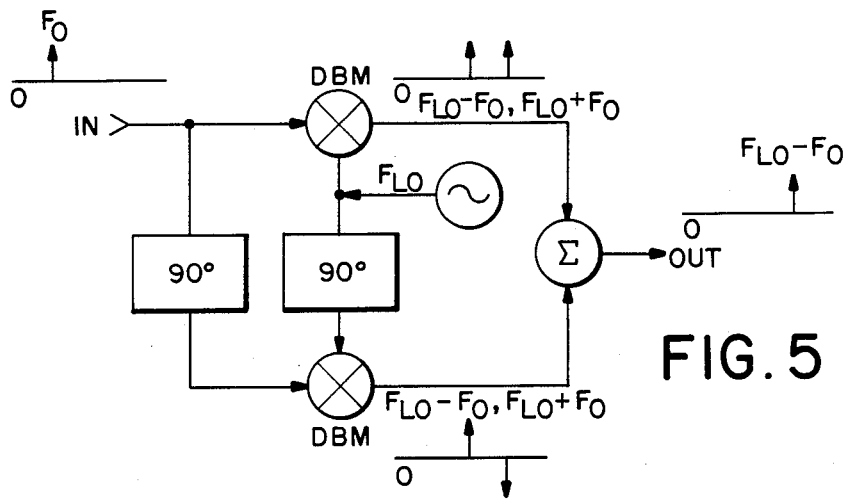
FIG. 5 is a block diagram of a circuit for converting up a frequency using a phasing technique.

Referring now to FIGS. 4 and 5 a means of turning the concept, as implemented in FIG. 3 as a phase measuring device, into a digital phase shifter is shown. The circuit must accept a cw input at $F_{sc}$ and convert a digital word into a precise phase, generating a stable $F_{sc}$ output appropriately phase shifted. The $F_{sc}$ input is mixed in a double balanced mixer (DBM) with a local oscillator frequency, $F_{lo}$, to produce $F_o$. $F_o$ is related to $F_{sc}$ and $F_0$ as follows:

$$F_o = F_{sc}/(N-1)$$

where $N=3600$ for 0.1° resolution.

$F_o$ is passed by a low pass filter to a convertor which converts the sine wave into a square wave for input to a phase detector. The other input to the phase detector is another $F_o$ derived from the local oscillator (VCXO) to provide a phase-lock loop for the oscillator. $F_{lo}$ is input into two divide-by-N counters which are offset one from the other by the desired phase shift. The output of one oscillator is compared with a microprocessor generated phase shift, and when there is a valid comparison the second counter is cleared to start counting. The output of the second counter is $F_o$ offset by the phase shift $\phi$ and is converted up to $F_{sc}$ by mixing in another double balanced mixer with $F_{lo}$. A band pass filter selects $F_{sc}$ from the second double balanced mixer.

Due to the small value of $F_o$ normal filters are not adequate to separate $F_{sc}$ from the output of the mixer. Therefore, as shown in FIG. 5 a phasing technique is used in lieu of the single mixer and band pass filter. Two modulators are driven in quadrature.

This causes one of the mixer outputs to be in phase with the corresponding other mixer output, and one output to be 180 degrees out of phase with its corresponding output. Thus, if the mixer outputs are added or subtracted, the undesired component can be cancelled, leaving $F_{sc}$.

Figure 6:
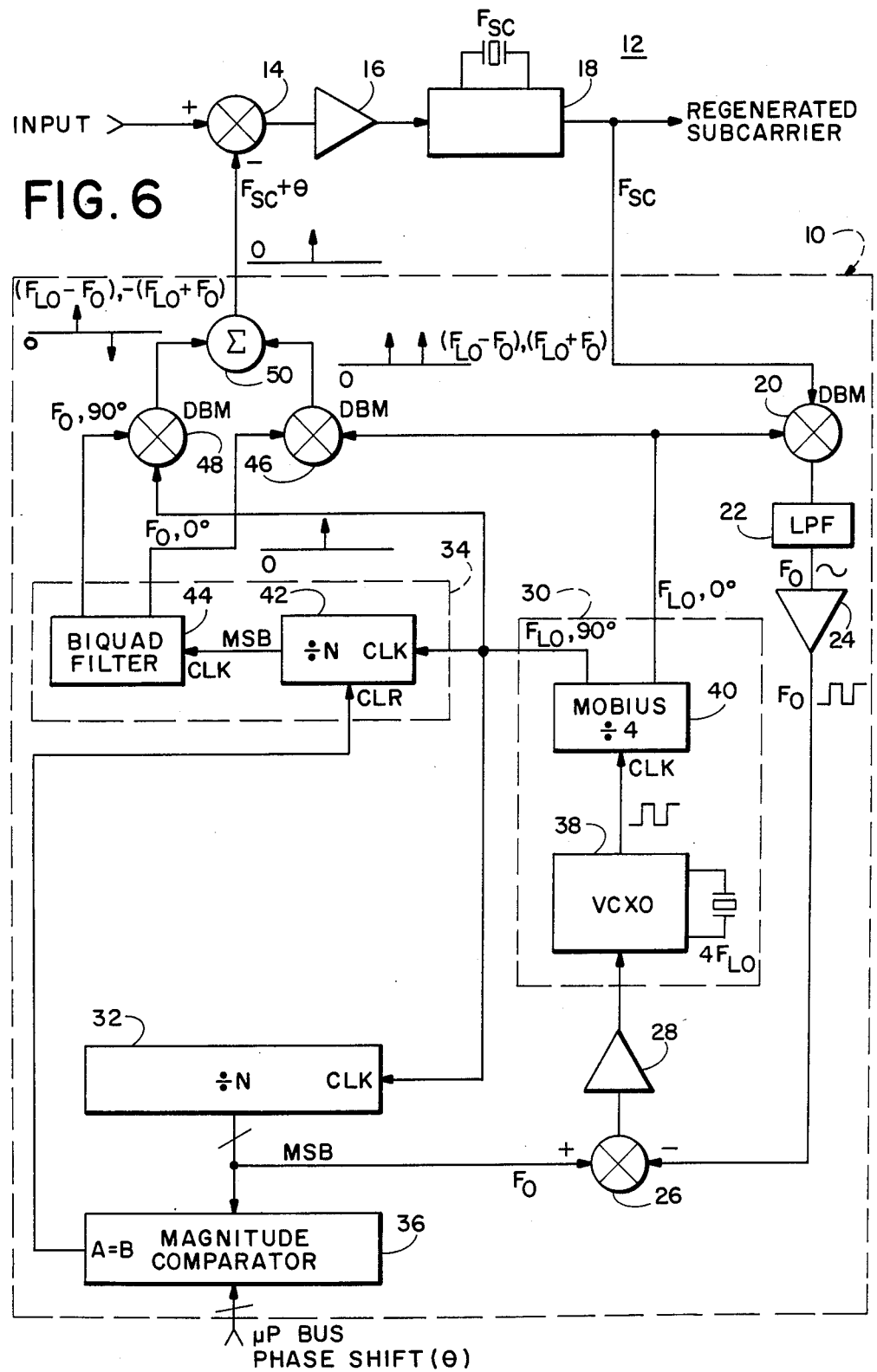
FIG. 6 is a block diagram of a subcarrier regenerator using a digital phase shifter according to the present invention.

A digital phase shifter 10 is shown in greater detail in FIG. 6 using the above-described heterodyne concept in a subcarrier regenerator 12. An input signal, such as a color burst signal from a conventional television composite signal, is input to a phase detector 14. The output of the phase detector 12 is input via an error amplifier 16 to a voltage controlled crystal oscillator (VCXO) 18. The output of the VCXO 18 is the cw regenerated subcarrier $F_{sc}$. To complete the phase-lock loop $F_{sc}$ is input to the digital phase shifter 10, the output of which is input to the phase detector 14.

$F_{sc}$ is input to a double balanced mixer 20 where it is mixed with a local oscillator frequency $F_{lo}$. The difference frequency $F_o$, where $F_o = F_{lo} - F_{sc}$, is passed by a low pass filter 22 and a convertor 24 to a sequential phase detector 26. The output of the sequential phase detector 26 is input via an error amplifier 28 to the local oscillator 30. $F_{lo}$ is also input to a divide-by-N counter 32 to provide a second signal at frequency $F_o$ which is the second input to the sequential phase detector 26, forming a second phase-lock loop for the local oscillator 30. Thus, $F_o = F_{lo} - F_{sc} = F_{lo}/N$.

A second divide-by-N counter 34 is clocked by $F_{lo}$ to provide another output at $F_o$. This counter 34 is cleared by an output from a magnitude comparator 36. A phase shift value ($\phi$) is loaded into the magnitude comparator 36 from a microprocessor and compared with the value of the first divide-by-N counter 32. When the comparison is "true", the output of the magnitude comparator 36 causes the output of the second counter 34 to shift by 0 by clearing the counter at that time. This produces an output at $F_o$ with a digitally controlled phase shift relative to the $F_o$ at the output of the counter 32. Therefore, whenever a new value is entered from the microprocessor to the magnitude comparator 36, the output of the second counter 34 is phase shifted by that amount.

Figure 8:
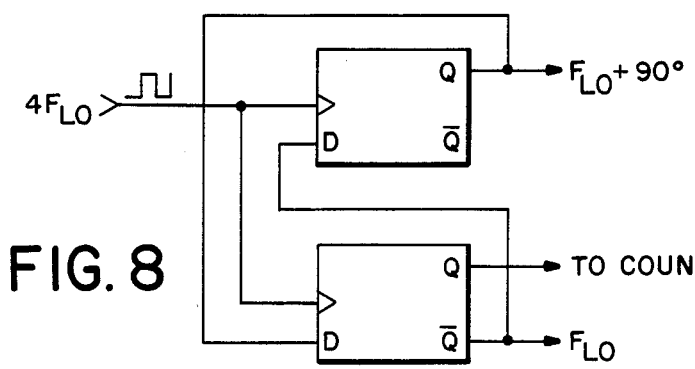
FIG. 8 is a schematic diagram for a Moebius counter as used in the present invention.
Figure 9:
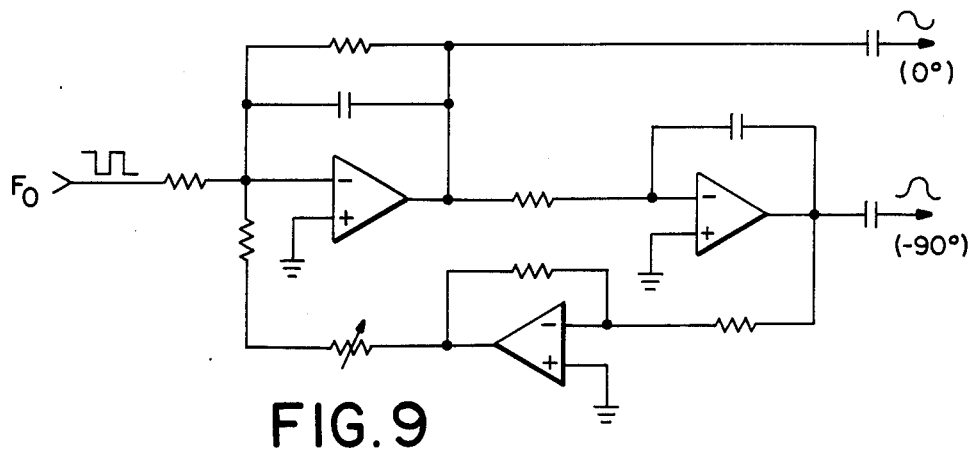
FIG. 9 is a schematic diagram for an active bi-quad filter as used in the present invention.

To generate the phase shifted subcarrier output $F_{sc} + \phi$, the output of the second counter 34, $F_o + \phi$, has to be converted up with $F_{lo}$. The mixer output is then at the sum and difference frequencies ($F_{lo} - F_o$ and $F_{lo} + F_o$), i.e., one frequency is at $F_{sc}$ and the other is $2F_o$ higher. Where $F_o$ is small these frequencies are difficult to separate with a simple band pass filter, or even a crystal filter. Therefore, the frequency conversion phasing technique is applied. The local oscillator 30 has a voltage controlled crystal oscillator (VCXO) 38 at $4F_{lo}$ and an output Moebius divide-by-4 counter 40, shown in FIG. 8, which provides two outputs of $F_{lo}$ in phase quadrature. Likewise the output of the second counter 34 provides two outputs of $F_o$ in phase quadrature by using an active bi-quad filter 44, shown in FIG. 9, to convert the output of the divide-by-N counter 42 into two quadrature sine waves at $F_o$. A pair of modulators 46, 48 are driven in quadrature by the quadrature $F_o$ and $F_0$ signals to produce two output signals, each having a sum and difference component. As shown the difference components are in phase with each other and the sum components are 180 degrees out of phase with each other. These outputs from the mixers 46, 48 are input to a summer 50 resulting in cancellation of the undesired output component, leaving $F_{sc}$ shifted by the amount $\phi$.

Figure 7:
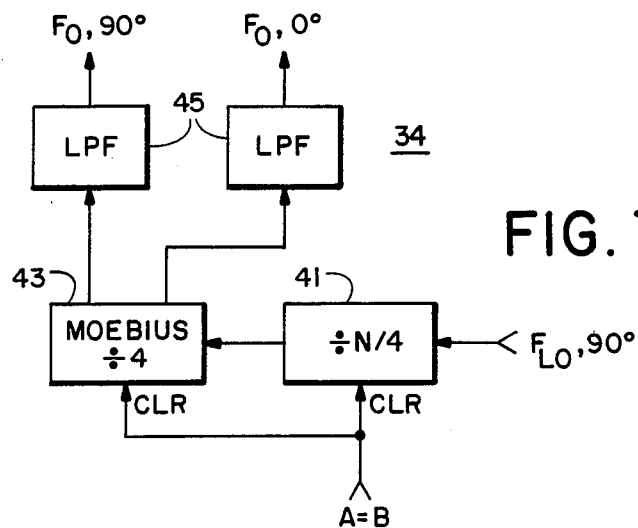
FIG. 7 is a block diagram of another embodiment for the quadrature circuit of FIG. 6.

FIG. 7 shows an alternative embodiment for the counter 34. This embodiment uses a divide-by-N/4 counter 41 and a Moebius divide-by-four counter 43 like the counter 40 in the local oscillator phase-lock loop. The outputs of the Moebius counter 43 are input through respective low pass filters 45 to the mixers 46, 48. The filters serve to recover the fundamental frequency $F_o$, i.e., convert the square waves from the Moebius counter 43 into sine waves. This embodiment may be used where N is a multiple of four.

Thus, the present invention provides a digital phase shifter using a heterodyning concept to produce a calibrated, high resolution, microprocessor controlled variable phase shifter which in a subcarrier regenerator allows remote, automated control of subcarrier phase, 0.1 degrees or better differential phase measurements, precise cable length measurements in degrees of subcarrier to a resolution of less than one inch, and improved reliability with reduced cost.

What is claimed is:

1. A digital phase shifter comprising:
    means for heterodyning an input continuous wave signal with a local oscillator frequency to output a difference frequency, the local oscillator frequency being an integer multiple of the difference frequency;
    means for counting the cycles of the local oscillator frequency to produce a digital count;
    means for comparing the digital count with an input digital phase shift value; and
    means for combining the output of the comparing means with the local oscillator frequency to produce a phase shifted continuous wave signal corresponding to the input continuous wave signal.

2. A digital phase shifter as recited in claim 1 wherein the combining means comprises:
    means for dividing the local oscillator frequency by N to produce a difference frequency shifted in phase with respect to the difference frequency from the heterodyning means by the output of the comparing means; and
    means for converting the phase shifted difference frequency up to the phase shifted continuous wave signal by mixing the phase shifted difference frequency with the local oscillator frequency.

3. A digital phase shifter as recited in claim 2 wherein the converting up means comprises:
    means for driving a pair of modulators in quadrature with quadrature components of the phase shifted difference frequency and the local oscillator frequency; and
    means for summing the output of the modulators to produce the phase shifted continuou wave signal.

4. A digital phase shifter as recited in claim 3 wherein the driving means comprises:
- a voltage controlled crystal oscillator operating at a frequency four times the local oscillator frequency;
- a Moebius counter for dividing the output of the voltage controlled crystal oscillator by four to produce two outputs of the local oscillator frequency in phase quadrature; and
- an active bi-quad filter for converting the phase shifted difference frequency into two phase shifted difference frequency outputs in phase quadrature.

5. A digital phase shifter as recited in claim 3 wherein the driving means comprises:
- a voltage controlled crystal oscillator operating at a frequency four times the local oscillator frequency;
- a first Moebius counter for dividing the output of the voltage controlled crystal oscillator by four to produce two outputs of the local oscillator frequency in phase quadrature; and
- a second Moebius counter for dividing the output of the dividing means by four to produce two outputs of the phase shifted difference frequency in phase quadrature, the dividing means dividing the local oscillator frequency by N/4.

6. A digital phase shifter as recited in claim 5 further comprising a low pass filter at each output of the second Moebius counter to convert the phase shifted difference frequency quadrature outputs into sine waves.

7. A digital phase shifter as recited in claim 1 further comprising means for phase-locking the local oscillator frequency.

8. A digital phase shifter as recited in claim 7 wherein the phase-locking means comprises:
- means for deriving from the counting means a second difference frequency; and
- a phase detector for comparing the second difference frequency with the difference frequency, the output of the phase detector controlling the local oscillator frequency.

9. A digital phase shifter comprising:
- means for heterodyning an input cw signal with a local oscillator frequency to produce a difference frequency, the difference frequency being an integer dividend of the local oscillator frequency;
- a phase-lock loop for controlling the local oscillator frequency;
- means for counting the cycles of the local oscillator frequency to produce a digital count and a second difference frequency;
- means for comparing the digital count with an input count, the input count being variable and representative of a desired phase shift of the input cw signal;
- means for dividing the local oscillator frequency by N, the dividing means being initiated each time the digital count equals the input count from the comparing means, to produce a difference frequency phase shifted with respect to the second difference frequency by the amount specified by the input count; and
- means for converting the phase shifted difference frequency up to the input cw signal frequency to produce a phase shifted cw signal corresponding to the input cw signal.

10. A digital phase shifter as recited in claim 9 wherein the converting means comprises:
- means for driving a pair of modulators in quadrature with quadrature components of the phase shifted difference frequency and the local oscillator frequency; and
- means for summing the output of the modulators to produce the phase shifted cw signal.

* * * * *